(12) United States Patent
Kaneyama

(10) Patent No.: US 6,483,110 B1
(45) Date of Patent: Nov. 19, 2002

(54) ELECTRON BEAM ENERGY FILTER

(75) Inventor: Toshikatsu Kaneyama, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 09/528,151

(22) Filed: Mar. 17, 2000

(30) Foreign Application Priority Data

Mar. 18, 1999 (JP) .......................................... 11-073457

(51) Int. Cl.⁷ .............................................. H01J 49/00
(52) U.S. Cl. ................................ 250/305; 250/396 ML
(58) Field of Search .............................. 250/492.1, 305, 250/311, 396 ML

(56) References Cited

U.S. PATENT DOCUMENTS

| | | | |
|---|---|---|---|
| 4,743,756 A | | 5/1988 | Krivanek ..................... 250/305 |
| 5,177,361 A | * | 1/1993 | Krahl et al. ................. 250/305 |
| 5,585,630 A | * | 12/1996 | Taniguchi et al. ........... 250/305 |
| 6,015,973 A | * | 1/2000 | Nunome ..................... 250/305 |

OTHER PUBLICATIONS

Communication from the European Patent Office enclosing the European Search Report for Application No. 00 30 2057 citing: JP 10 199458 A (Hitachi Ltd.) Jul. 31, 1998

*abstract*, Patent Abstracts of Japan, vol. 1998 No. 12 (Oct. 31, 1998).

* cited by examiner

Primary Examiner—John R. Lee
Assistant Examiner—David A. Vanore
(74) Attorney, Agent, or Firm—Webb Ziesenheim Logsdon Orkin & Hanson, P.C.

(57) ABSTRACT

There is disclosed an energy filter for use in an electron microscope, the energy filter having an electron passage that can be evacuated more reliably than heretofore. The filter can be designed compactly without increasing the polepiece gaps or the spaces to accommodate coils. The energy filter has an electron-deflecting magnet assembly. This assembly comprises a pair of opposite polepiece bases, a pair of spacers interposed between the polepiece bases, and a yoke mounted to side surfaces of the polepiece bases. Magnetic polepieces and coil grooves of a given width are formed in the opposite surfaces of the polepiece bases. Bulges forming shunts are formed outside the coil grooves in the polepiece bases. O-ring grooves are formed in the spacers on the sides of the polepiece bases around the coil grooves. Electron passage grooves are formed in the opposite surfaces of the spacers to form the electron passage.

4 Claims, 14 Drawing Sheets

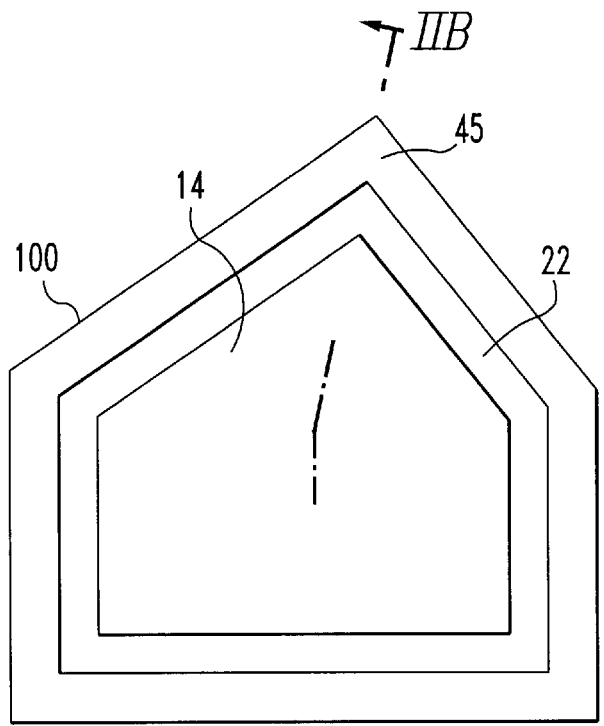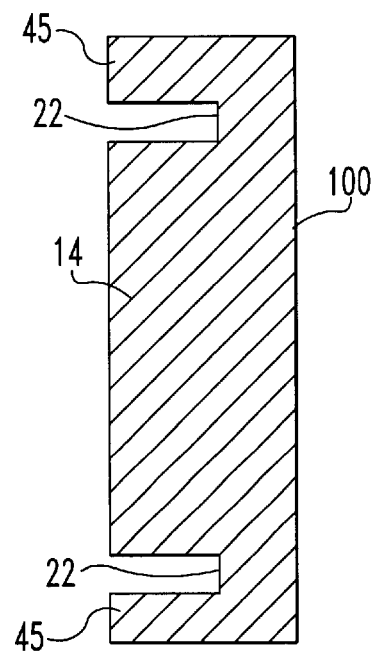
FIG.2(a)   FIG.2(b)
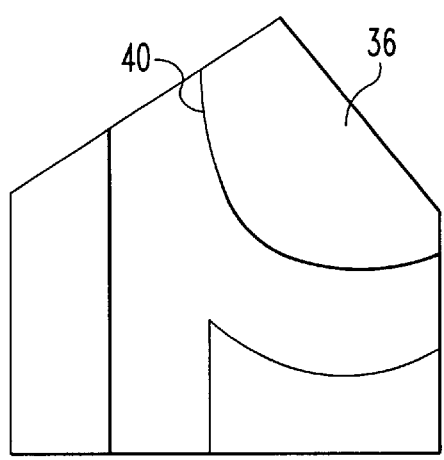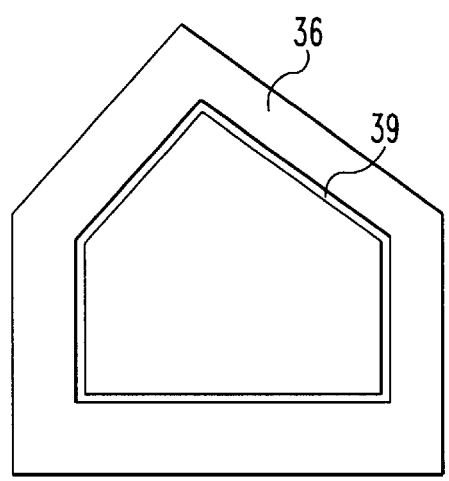
FIG.3(a)   FIG.3(b)

ELECTRON BEAM ENERGY FILTER

BACKGROUND OF THE INVENTION

1. Field of the Invention

The present invention relates to an energy filter consisting of at least one electron-deflecting magnet assembly to pass incident electrons which have a certain energy.

2. Description of the Related Art

Electron microscopes having electron optics incorporating an energy filter have been developed. Such a conventional electron microscope is shown in FIG. 6, in which the microscope is indicated by numeral 1. This microscope has an electron gun 2 emitting a beam of electrons e. The beam is directed to a specimen 5 via a condenser lens system 3. The beam transmitted through the specimen 5 is projected onto a fluorescent screen 11 via an objective lens 4, an intermediate lens 6, an entrance aperture 7, a spectrometer 8, a slit 9, and a projector lens 10. Thus, a transmission image of the specimen is observed. The entrance aperture 7, the spectrometer 8, and the slit 9 constitute an energy filter 12, known as an Ω-filter.

The spectrometer 8 incorporated in the energy filter 12 of the electron microscope 1 is equipped with at least one electron-deflecting magnet assembly. One example of the electron-deflecting magnet assembly is shown in FIGS. 7(a) and 7(b), where the magnet assembly, indicated by 13, comprises a pair of opposed magnetic polepiece bases 100, 101. Coil grooves 22 and 24 are formed adjacent to each other in one surface of the magnetic polepiece base 100. Thus, those portions which are surrounded by the coil grooves 22 and 24 form magnetic polepieces 14 and 16, respectively. Coils 18 and 20 are received in the coil grooves 22 and 24, respectively. Similarly, the other magnetic polepiece base 101 is provided with coil grooves 23 and 25 formed adjacent to each other. Thus, those portions which are surrounded by the coil grooves 22 and 24 form polepieces 15 and 17, respectively. Coils 19 and 21 are received in the coil grooves 23 and 25, respectively. The polepiece bases 100 and 101 are so positioned that the formed polepieces 14 and 16 are located opposite to the polepieces 15 and 17, respectively. Those portions of the polepieces 14–17 that are surrounded by the coil grooves 22–25 are recessed as viewed from the other portions. Gaps 26 and 27 are formed between them and in communication with each other via a passage 28. These gaps 26, 27, and passage 28 together form an electron passage 29.

Electrical current is supplied from a current source (not shown) to the coils 18–21 to produce magnetic fields in the gaps 26 and 27 between the polepieces 14 and 15 and between the polepieces 16 and 17, respectively. Shunts (not shown) are mounted at the entrance and exit surfaces of the gaps 26 and 27 to prevent ooze or spreading of the magnetic fields. Using these shunts, the distributions of the magnetic fields developed in the gaps 26 and 27 between the polepieces are tightly controlled. Electrons are caused to pass through these magnetic fields. This gives good electron optical characteristics to the electron-deflecting magnet assembly 13 acting to deflect electrons.

Electrons react with molecules within air and are lost rapidly. It is necessary to evacuate the coil grooves 22–25 and the electron passage 29 within the electron-deflection magnet assembly 13 to create a low-pressure condition. In the past, therefore, the electron-deflecting magnet assembly 13 itself has been accommodated within a vacuum chamber. With this method for evacuating the electron-deflecting magnet assembly 13, however, it is very difficult to pump down the inside of the magnet assembly 13 because the components of the magnet assembly 13, such as the coils 18–21, have large surface areas. Where there is a large amount of residual gas, the electron microscope 1 fitted with the energy filter 12 suffers from various problems, such as instability of the accelerating voltage and specimen contamination due to electron irradiation.

In an attempt to solve these problems, the following two methods have been adopted. A first method consists of placing a tube 30 along an electron passage 29 as shown in FIG. 8 and evacuating only the inside of the tube 30. With this first method, it can be expected that the aforementioned problems will be solved at the highest efficiency, since the volume evacuated is smallest.

A second method consists of covering the coils 18–21 with vacuum-resistant packs 31–34, respectively, as shown in FIG. 9, to suppress degassing from the coils 18–21. With this second method, intrusion of gas into the electron passage 29 is suppressed, the gas escaping from the coils 18–21. Therefore, the aforementioned problems can be effectively solved.

With the first method, it is necessary to accurately shape the tube 30. Since the tube 30 is very complex in shape, it is very difficult to shape the tube 30 accurately. Furthermore, it is necessary to clean the inside of the tube 30. However, it is not easy to finish the interior of the tube 30 with a high degree of cleanliness.

To put the tube 30 in the electron passage 29, the gaps 26 and 27 between the polepieces 14 and 15 and between the polepieces 16 and 17 are inevitably set large. If these gaps are made large, a larger power supply is necessary to produce a given magnitude of magnetic field. In addition, the aberrations of the deflecting magnetic field increase. Accordingly, limitations are imposed on increase of the gaps 26 and 27.

In the second method described above, the coils 18–21 are separately covered with the vacuum-resistant packs 31–34, respectively. Therefore, the coil grooves 22–25 in the coils 18–21 must have large space. This increases the size and complexity of the electron-deflecting magnet assembly 13. Additionally, the gap between each shunt and the corresponding polepieces, such as 14–17, is increased to secure spaces to accommodate the coils 18–21.

SUMMARY OF THE INVENTION

In view of the foregoing, the present invention has been made.

It is an object of the present invention to provide an energy filter that can be designed compactly without increasing the gaps between polepieces or spaces to accommodate coils and has an electron passage capable of being evacuated more reliably.

An energy filter built in accordance with a first embodiment of the present invention solves the foregoing problems and comprises at least one magnet assembly mounted in a vacuum created within an electron microscope, the magnet assembly being designed to pass only incident electrons which have a certain energy. The magnet assembly comprises a pair of polepiece bases located opposite to each other, polepieces and coil grooves formed in respective surfaces of the polepiece bases, coils inserted in the coil grooves, respectively, a pair of spacers interposed between the polepiece bases, and a yoke fixedly mounted to side surfaces of the polepiece bases. The coil grooves are located opposite to each other. The spacers are provided with sealing grooves to accommodate hermetic seals, respectively, for hermetically sealing the coils received in the coil grooves in the opposite polepiece bases, respectively. At least one electron passage gap is between the spacers to form an electron passage. Seal members are inserted in the sealing grooves, respectively, to permit the coils to be located outside the vacuum described above.

An energy filter in accordance with a second embodiment of the present invention is based on the energy filter in accordance with the first embodiment and further characterized in that the polepieces have bulges swelling outward from the coil grooves, respectively, to form shunts for preventing ooze of magnetic fields.

An energy filter in accordance with a third embodiment of the present invention is based on the energy filter in accordance with the first or second embodiment and further characterized in that at least one magnet assembly described above is plural and fixedly mounted to a platen.

An energy filter in accordance with a fourth embodiment of the invention is based on the energy filter in accordance with the first or second embodiment and has the following features. The aforementioned at least one magnet assembly is plural. The magnet assemblies include first magnet assemblies having a pair of polepiece bases which are integrally fabricated, respectively, and a pair of spacers which are integrally fabricated, respectively. The electron passage gap is formed between the integrally fabricated spacers. Sealing grooves are formed in the integrally fabricated spacers, respectively. Sealing members are received in the sealing grooves, respectively.

In the energy filter constructed as described above, the sealing members permit the coils of the magnets to be located outside the vacuum, and the coils are not brought within the vacuum. This prevents deterioration of the vacuum inside the electron microscope. Hence, the performance of the electron microscope is prevented from deteriorating.

The electron passage gap formed between the spacers form a single electron passage. This passage is much easier to machine and clean than the conventional tube described above.

Since no tube is accommodated within the electron passage, it is not necessary to secure a large space between the opposite polepieces. In consequence, the magnet assembly can be designed compactly. Furthermore, only a small-size power supply suffices.

The shunts for preventing ooze of the magnetic fields are formed integrally with the polepieces at the bulges of the polepieces. Therefore, it is not necessary to take account of the accuracy with which these components are assembled. The magnet assembly can be assembled easily.

Other objects and features of the invention will appear in the course of the description thereof, which follows.

BRIEF DESCRIPTION OF THE DRAWINGS

FIG. 2(a) is a plan view of one polepiece base of the electron-deflecting magnet assembly shown in FIG. 1(a), showing a plane at which a coil groove is formed;

FIG. 2(b) is a cross-sectional view taken on line IIB—IIB of FIG. 2(a);

FIG. 3(a) is a plan view of one spacer of the electron-deflecting magnet assembly shown in FIG. 1(a), showing a plane at which an electron passage groove is formed;

FIG. 3(b) is a plan view of the spacer shown in FIG. 3(a), showing a plane at which an O-ring groove is formed;

DESCRIPTION OF THE PREFERRED EMBODIMENTS

Figure 1A:
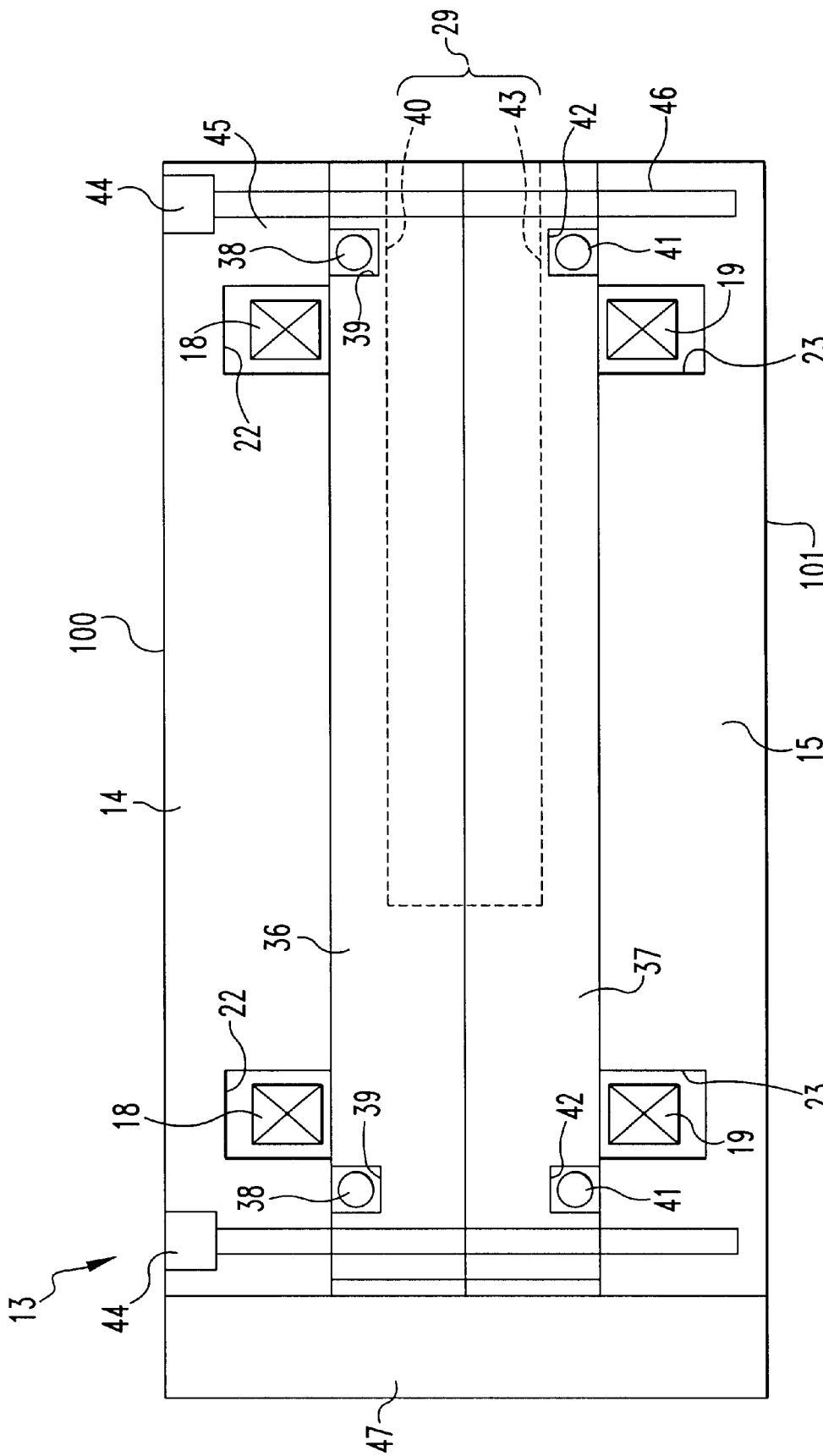
FIG. 1(a) is a view of an electron-deflection magnet assembly in a spectrometer used in an energy filter in accordance with the present invention.
Figure 1B:
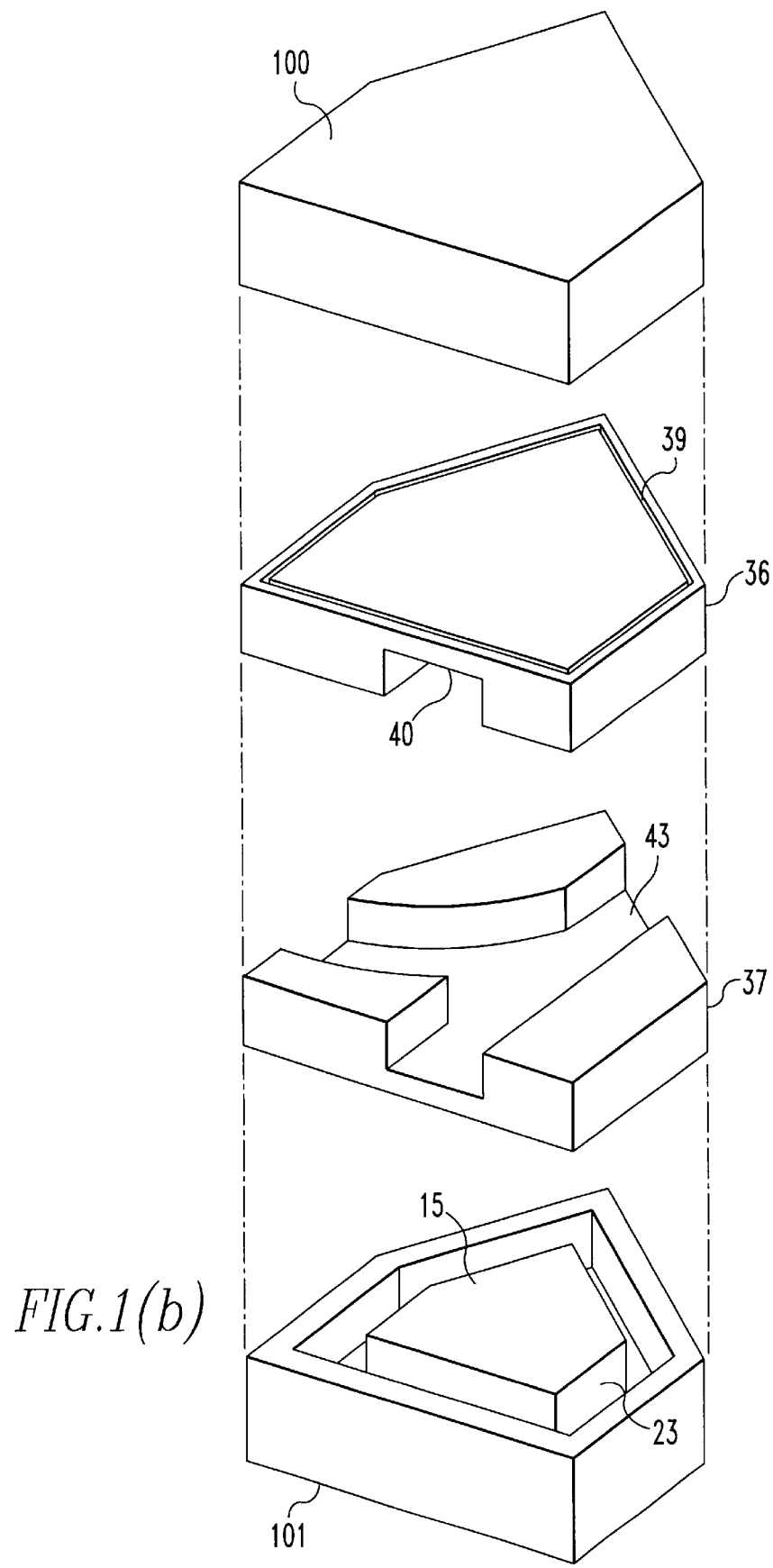
FIG. 1(b) is an assembly drawing of an electron-deflection magnet assembly in a spectrometer used in an energy filter in accordance with the present invention.

The preferred embodiments of the present invention are hereinafter described in detail by referring to the drawings. FIGS. 1(a) and 1(b) show an electron-deflecting magnet assembly incorporated in a spectrometer that is used in an energy filter in accordance with the present invention. Note that like components are indicated by like reference numerals in various figures and that those components which have been already described will not be described in detail below.

Referring to FIGS. 1(a) and 1(b), the electron-deflecting magnet assembly, generally indicated by reference numeral 13, has a pair of polepiece bases 100, 101. As shown in FIGS. 2(a) and 2(b), the side of one polepiece base 100 that faces the other polepiece base 101 is provided with a coil groove 22 of a given width. This groove 22 forms a closed loop and accommodates a coil 18. That portion which is surrounded by the coil groove 22 forms a magnetic polepiece 14. The surface of the polepiece base 100 that faces the polepiece base 101 is flush except for the portion where the coil groove 22 is formed.

The other polepiece base 101 is identical in contour to the polepiece base 100. The side of this polepiece base 101 facing the polepiece base 100 is similarly provided with a coil groove 23 (shown in FIGS. 3(a) and 3(b)) of the same width as the coil groove 22. The groove 23 forms a closed loop and accommodates a coil 19. That portion which is surrounded by the coil groove 23 forms a magnetic polepiece 15. The surface of the polepiece base 101 that faces the polepiece base 100 is flush except for the portion where the coil groove 23 is formed. Where the polepiece bases 100 and 101 are made to overlap each other, the coil grooves 22 and 23 are placed opposite to each other. Accordingly, the polepieces 14 and 15 are also located opposite to each other.

Figure 7A:
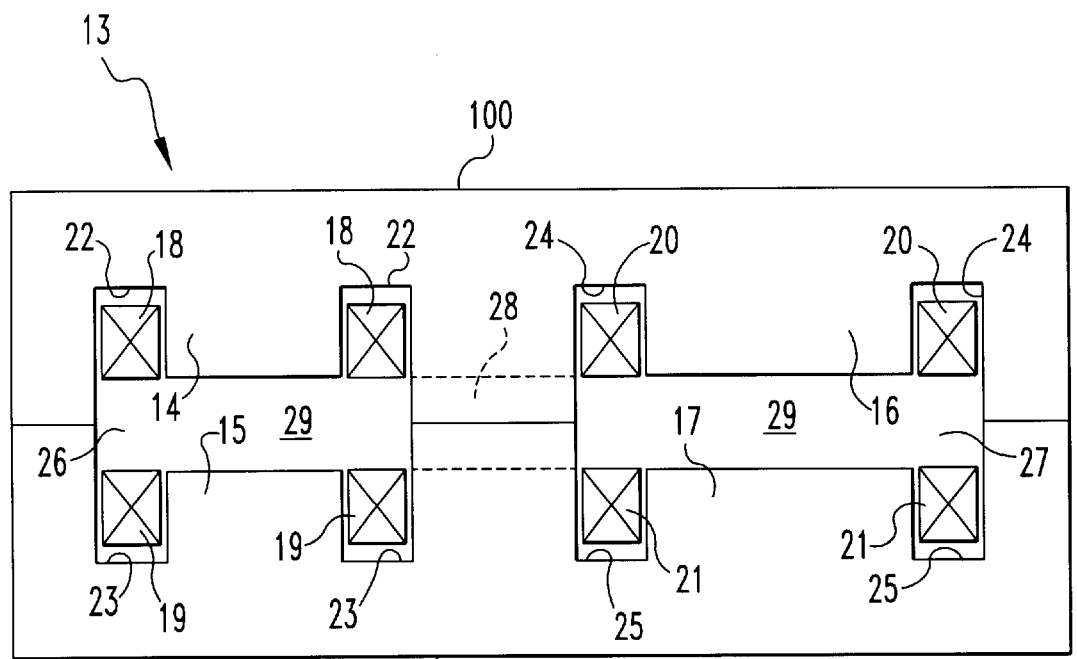
FIG. 7(a) is a view of an electron-deflecting magnet assembly used in the prior art spectrometer.
Figure 8:
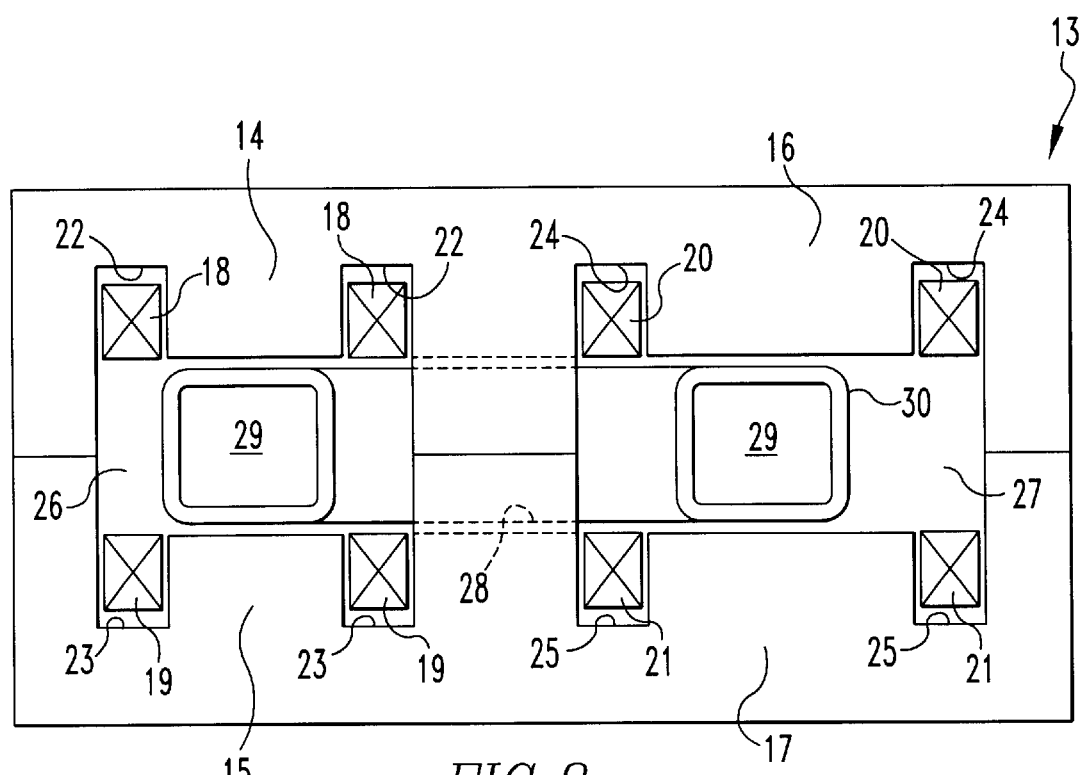
FIG. 8 is a view illustrating a first method of solving the problems with the prior art electron-deflecting magnet assembly shown in FIG. 7(a)
Figure 7B:
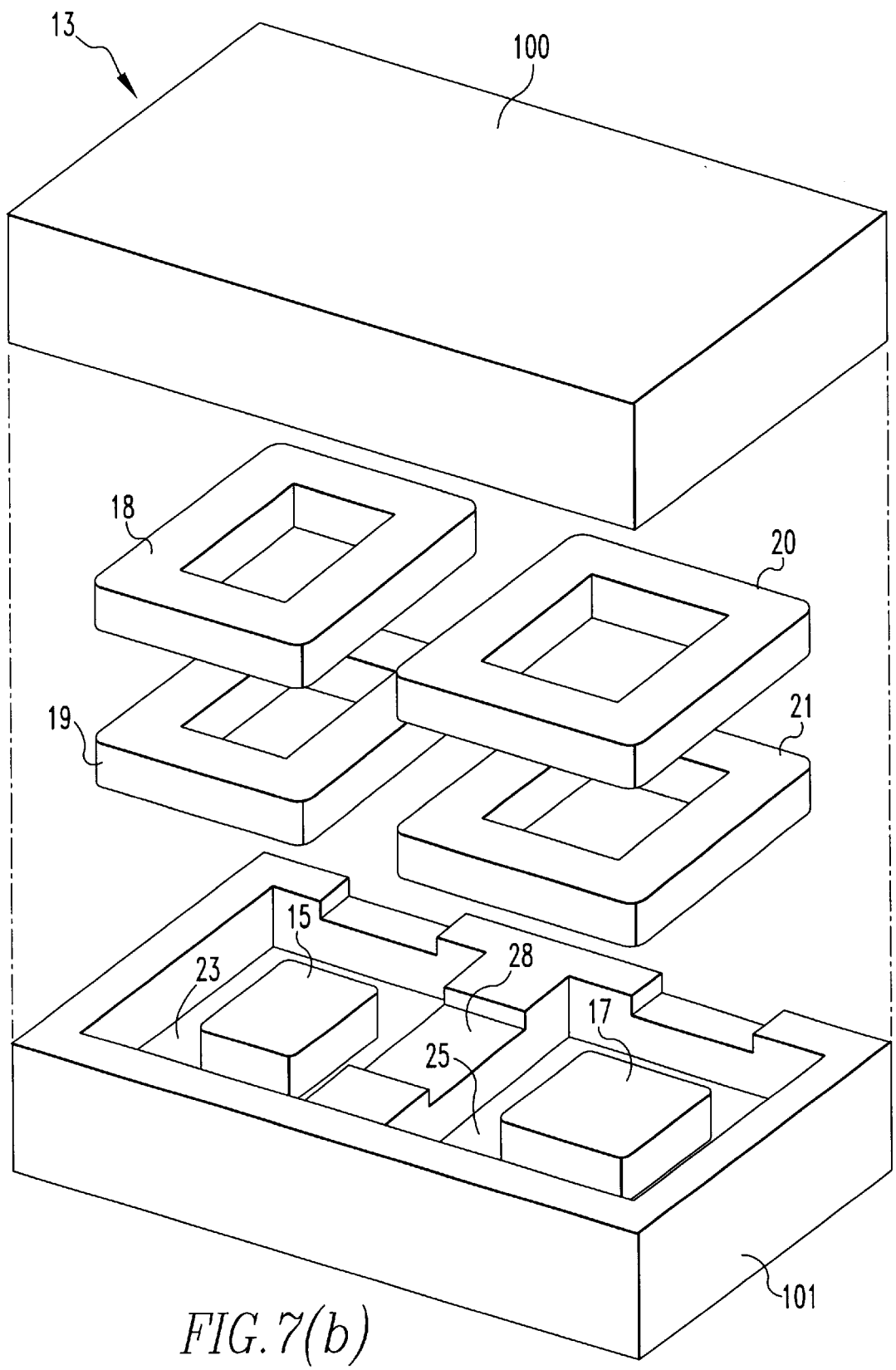
FIG. 7(b) is an assembly drawing of an electron-deflecting magnet assembly used in the prior art spectrometer.
Figure 9:
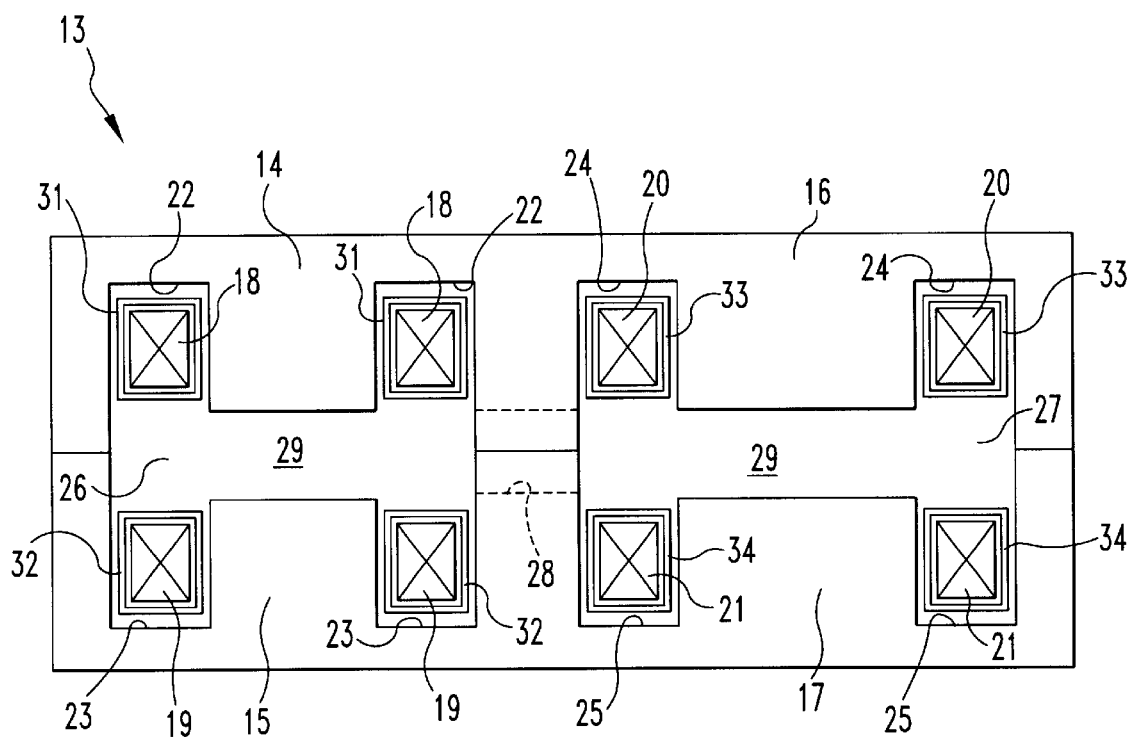
FIG. 9 is a view illustrating a second method of solving the problems with the prior art electron-deflecting magnet assembly shown in FIG. 7(a)

A pair of spacers 36, 37, each consisting of a flat plate, are mounted between the polepiece bases 100 and 101. As shown in FIGS. 3(*a*) and 3(*b*), one spacer 36 is identical in contour with the polepiece base 100. The thickness of the spacer 36 is half the length of the gap 26 of the prior art electron-deflecting magnet assembly 13 (FIGS. 7–9) taken in the direction along which the polepiece bases 100 and 101 are spaced from each other.

The surface of one spacer 36 that faces the polepiece 14 is provided with an O-ring groove 39 forming a closed loop. An O-ring 38 (FIG. 1(*a*)) is inserted in this groove 39 (FIGS. 1(*a*) and 1(*b*)), which is located around the coil groove 22. The surface of one spacer 36 that faces the other spacer 37 is provided with an electron passage groove 40 forming a part of an electron passage 29.

The other spacer 37 is identical in contour and thickness with spacer 36. The surface of the other spacer 37 that faces the other polepiece base 101 is provided with an O-ring groove 42 (FIG. 1(*a*)) forming a closed loop. An O-ring 41 (FIG. 1(*a*)) is received in this groove 42, which is located around the coil groove 23. The surface of the spacer 37 facing the spacer 36 is formed with an electron passage groove 43 (FIGS. 1(*a*) and 1(*b*)) forming the remaining part of the electron passage 29. Where the spacers 36 and 37 are made to overlap each other as shown in FIGS. 1(*a*) and 1(*b*), the electron passage grooves 40 and 43 are placed opposite to each other, forming the single electron passage 29.

Figure 10A:
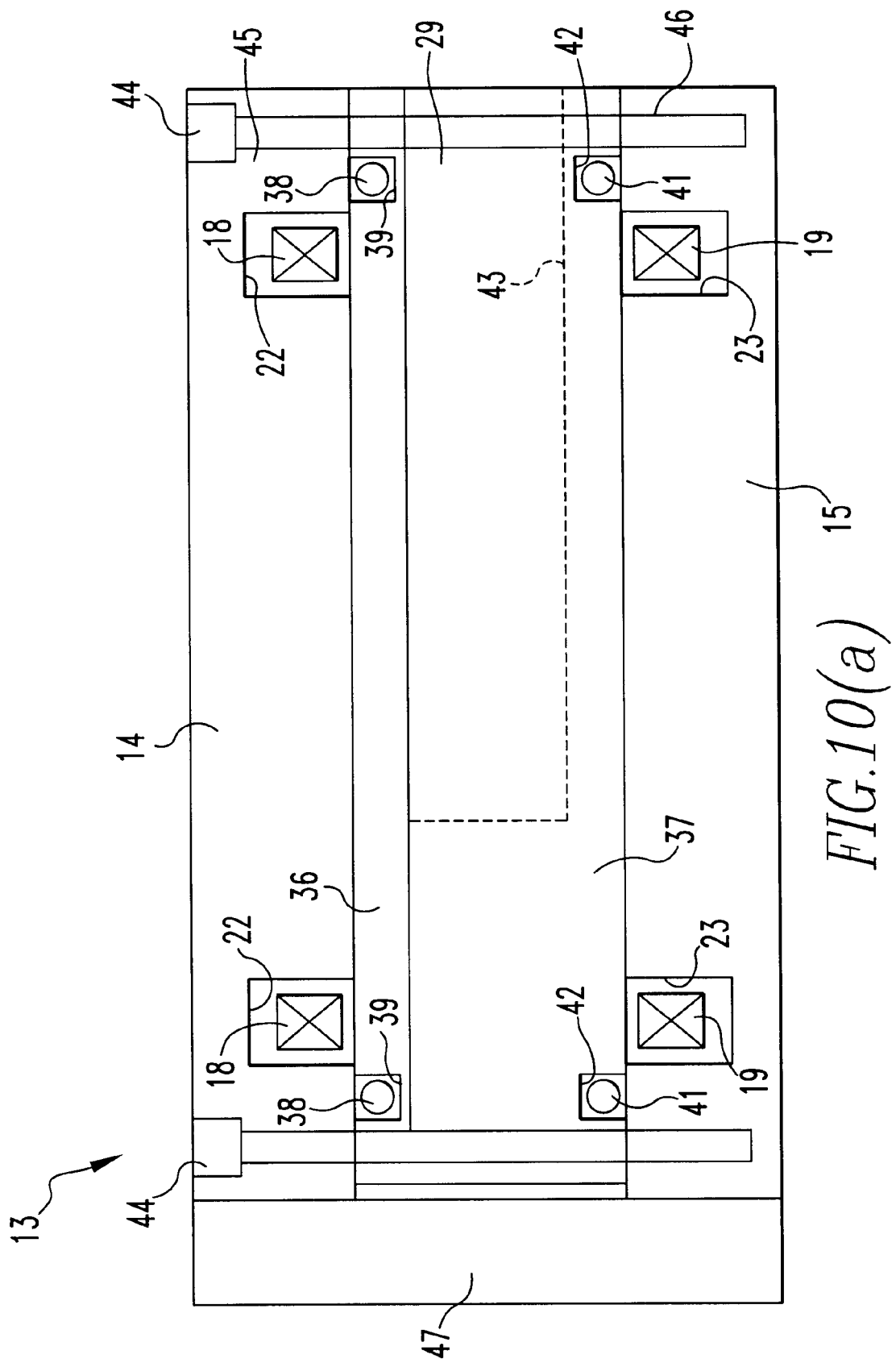
FIG. 10(a) is a view of a modification of the spacers shown in FIG. 1(a)
Figure 10B:
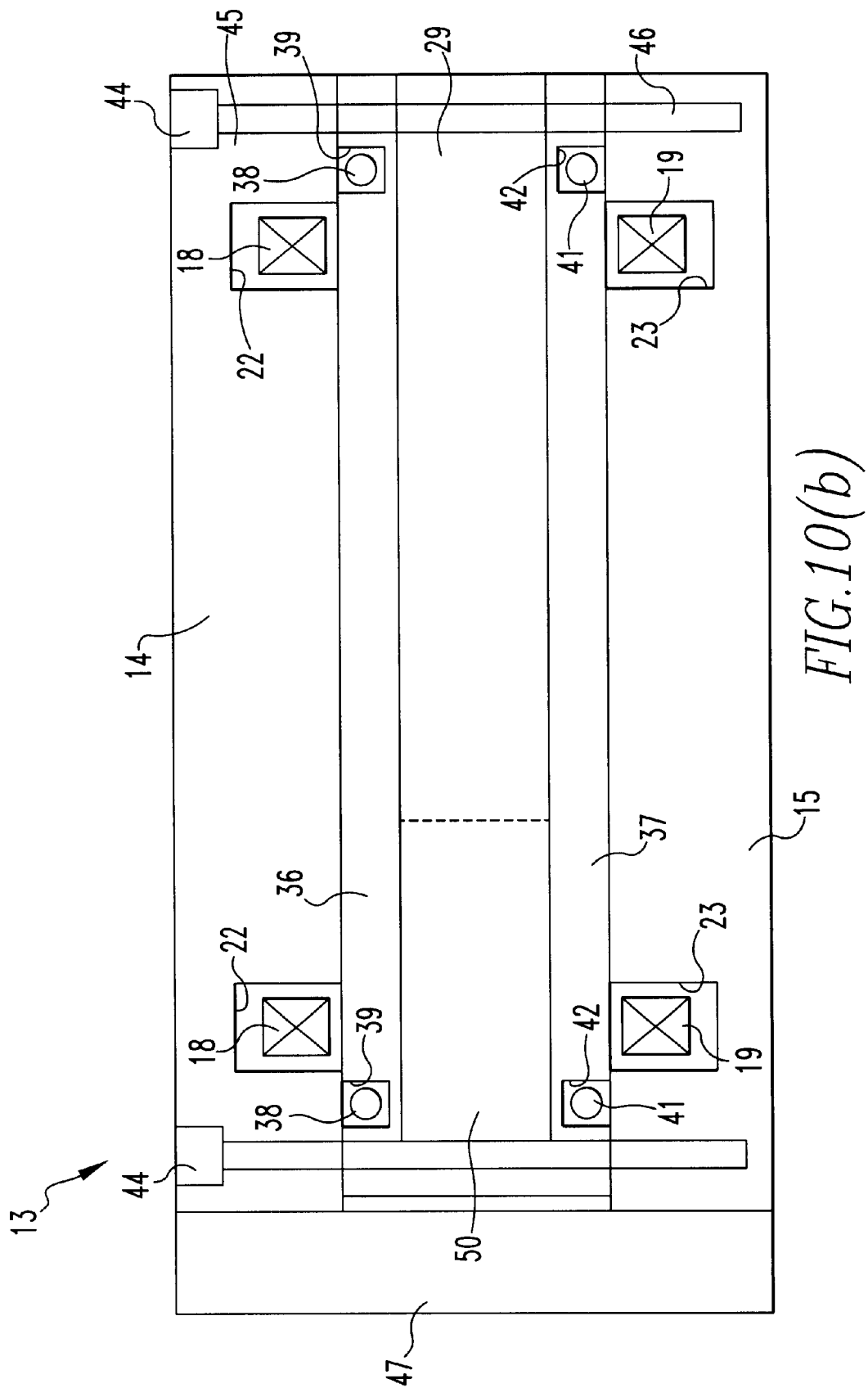
FIG. 10(b) is a view of another modification of the spacers shown in FIG. 1(a)
Figure 10C:
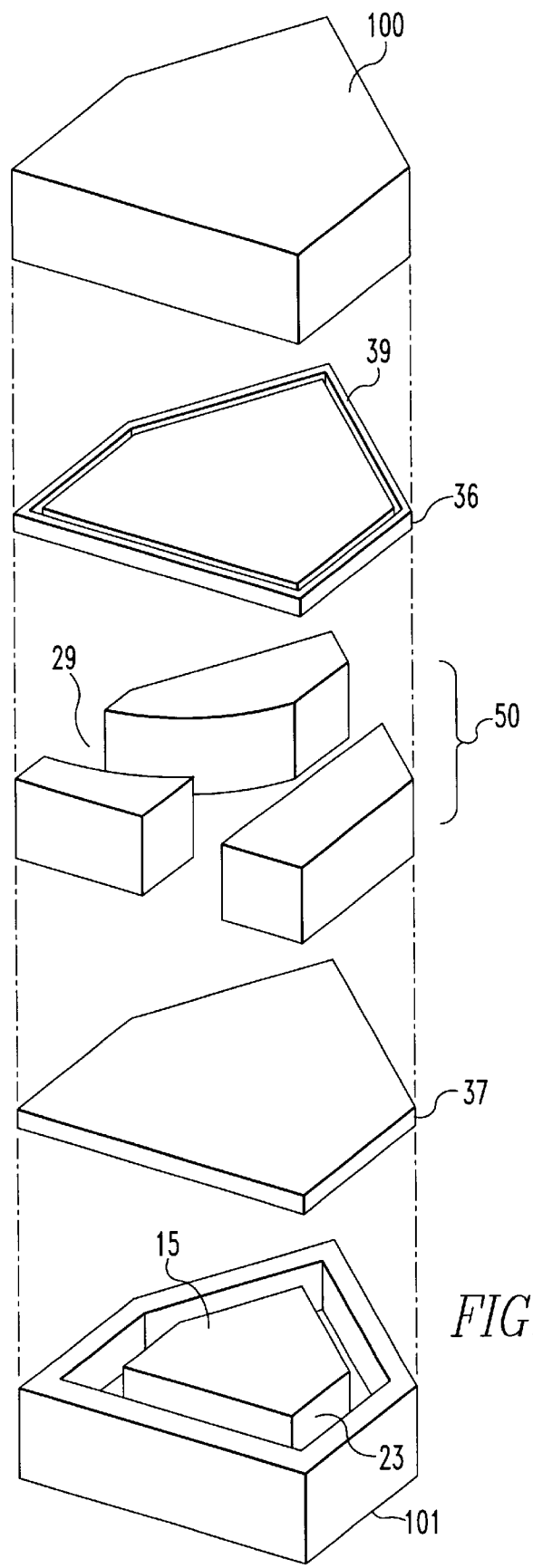
FIG. 10(c) is an assembly drawing of the spacers shown in FIG. 10(b)

As shown in FIG. 10(*a*), the electron passage 29 may have a deeper groove portion 43 whose depth is equal to the sum of the depths of the electron passage grooves 40 and 43 of the structure shown in FIG. 1(*a*). The deeper groove portion 43 is formed only in one (e.g., the spacer 37) of the two spacers 36 and 37. In this case, the spacer 36 has no electron passage groove.

As shown in FIGS. 10(*b*) and 10(*c*), the electron passage 29 may made by inserting third spacers 50 between the spacers 36 and 37 which have no electron passage groove. The thickness of the third spacers 50 is equal to the depth of the deeper groove 43.

After fitting the O-rings 38 and 41 in the O-ring grooves 39 and 42, respectively, the spacers 36 and 37 are inserted between the polepiece bases 100 and 101 and made to overlap completely. Under this condition, a given number of screws 44 are inserted into one polepiece base 100 and into the other polepiece base 101 through the spacers 36, 37 outside the O-ring grooves 39 and 42. Thus, the polepiece bases 100, 101 and the spacers 36, 37 are coupled together.

After the polepiece bases 100, 101 and the spacers 36, 37 have been coupled together in this way, the coils 18 and 19 are located in the O-rings 38 and 41, respectively, and hermetically confined between the polepiece base 100 and the spacer 36 and between the polepiece base 101 and the spacer 37, respectively, by the O-rings 38 and 41, respectively. The polepiece bases 100 and 101 have bulges 45 and 46, respectively, swelling outward from the coil grooves 22 and 23, respectively. These bulges 45 and 46 act as shunts for suppressing ooze of magnetic fields.

A yoke 47 is mounted to side surfaces of the polepiece bases 100 and 101. This yoke 47 completes a magnetic circuit and forms the electron-deflecting magnet assembly 13.

The electron-deflecting magnet assembly 13 constructed in this manner is aligned within the vacuum vessel of the electron microscope and fixed. Since the coils 18 and 19 are confined between the polepiece bases 100, 101 and the spacers 36, 37, respectively, by the closed-loop O-rings 38 and 41 as mentioned above, the electron passage 29 can be evacuated while leaving the vicinities of the coils surrounded by the O-rings 38 and 41 at atmospheric pressure.

In this example of energy filter 12, the O-rings 38 and 41, each forming a closed loop, prevent the coils 18 and 19 of the electron-deflecting magnet assembly 13 in the spectrometer 8 from entering a vacuum. Therefore, the vacuum inside the electron microscope 1 is prevented from being impaired. This prevents the performance of the microscope 1 from being deteriorated.

Furthermore, the coils 18 and 19 are directly mounted in the coil grooves 22 and 23, respectively, in the polepiece bases 100 and 101 and so these coil grooves 22 and 23 can be reduced in size. Consequently, magnetic shielding can be accomplished efficiently.

The single electron passage 29 is formed by the electron passage grooves 40 and 43 formed in the spacers 36 and 37, respectively. Therefore, neither a difficult machining operation nor a difficult cleaning operation is necessary, unlike the above-described conventional first method of machining the tube 30 of complex shape. Moreover, the spacer is composed of at least two parts, or 36 and 37. This further facilitates machining the spacer.

In addition, the tube 30 is not accommodated in the electron passage 29. This makes unnecessary to set large the distance between the polepieces 14 and 15. Hence, the electron-deflecting magnet assembly 13 can be designed compactly. It is not necessary to use a large-sized power supply.

Further, the shunts for preventing ooze of magnetic fields are coupled to the polepieces 14 and 15 at their bulges 45 and 46. Therefore, it is not necessary to take account of the assembly accuracy for them. This improves the efficiency of the operation for assembling the magnet assembly 13.

Figure 4:
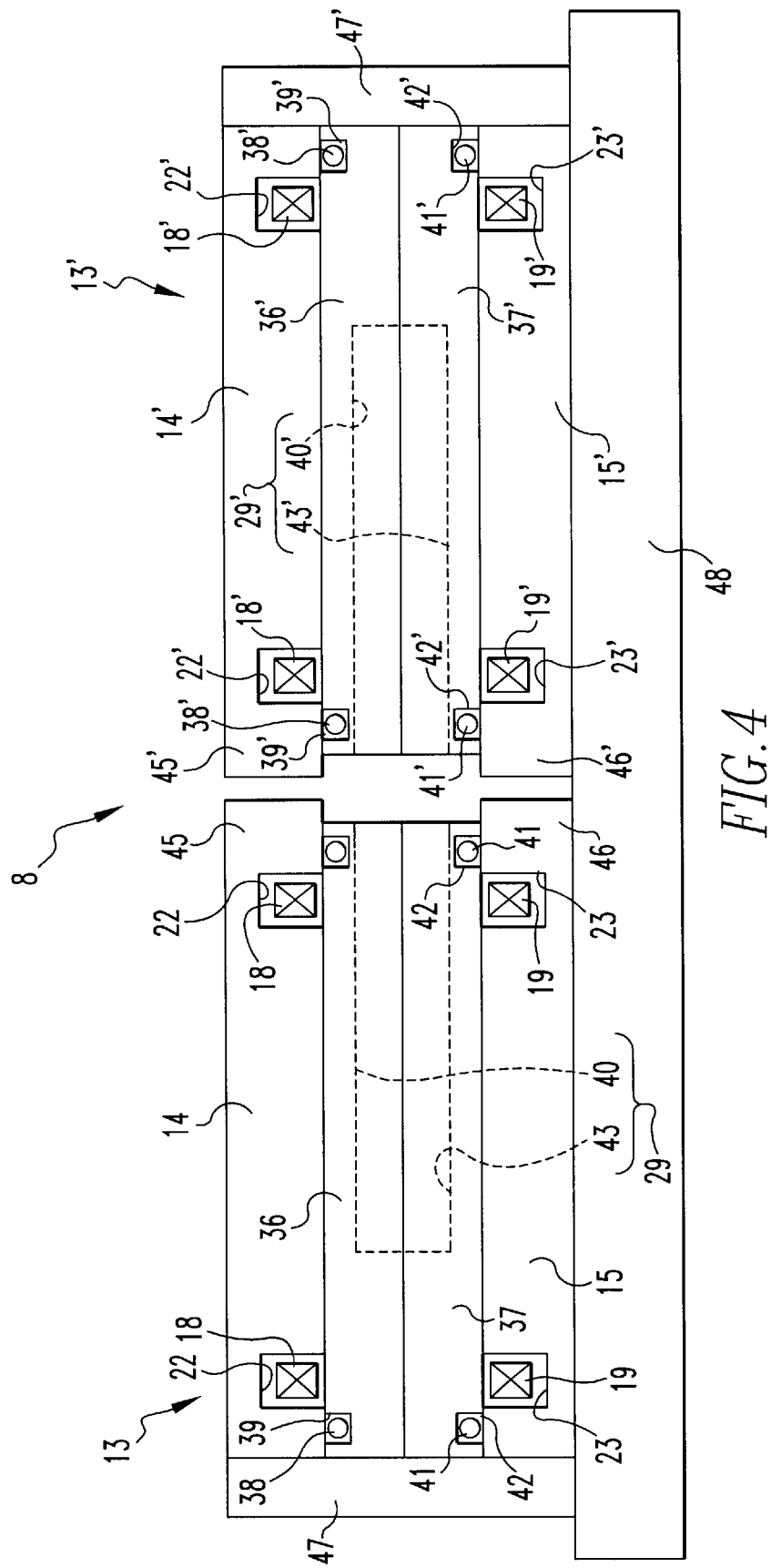
FIG. 4 is a view of an energy filter composed of plural discrete electron-deflecting magnet subassemblies.

In the above example, the spectrometer 8 is made of one electron-deflecting magnet assembly 13. The spectrometer 8 may also be made of plural electron-deflecting magnet assemblies or subassemblies each of which has the same structure as the aforementioned electron-deflecting magnet assembly 13. For example, where the spectrometer 8 is made up of two identical electron-deflecting magnet assemblies 13 and 13', these magnet assemblies 13 and 13' are mounted on a platen 48 as shown in FIG. 4. The magnet assemblies 13 and 13' have yokes 47 and 47', respectively. The two magnet assemblies 13 and 13' are mounted to the platen 48 such that unfixed side surfaces of the yokes 47 and 47' are located opposite to each other. Those components of the electron-deflecting magnet assembly 13' which correspond to their counterparts of the electron-deflecting magnet assembly 13 are indicated by like reference numerals with "'" attached, and these components indicated by numerals with prime "'" will not be described in detail below.

Figure 5:
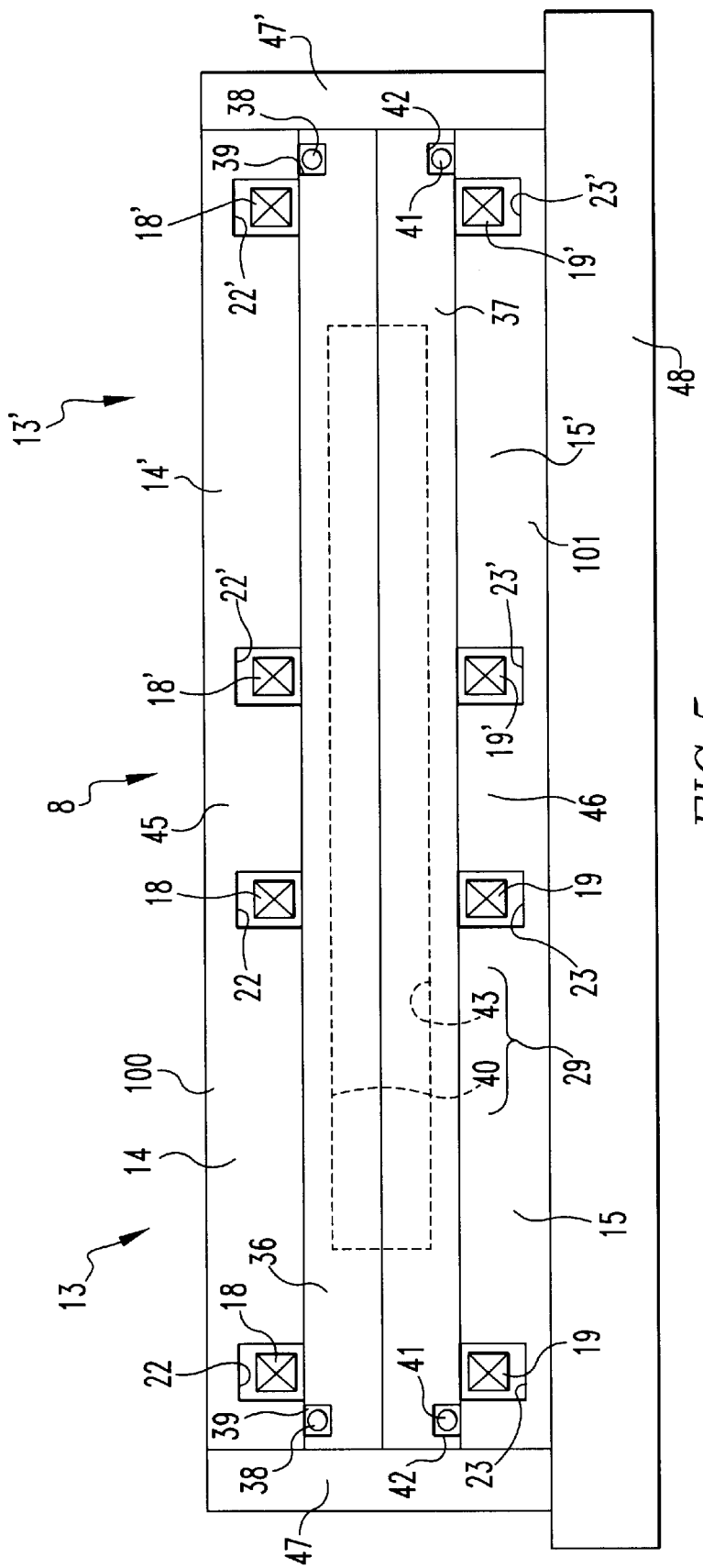
FIG. 5 is a view of an energy filter in which some of electron-deflecting magnet subassemblies are fabricated integrally, while the others are formed by a large common member.
Figure 6:
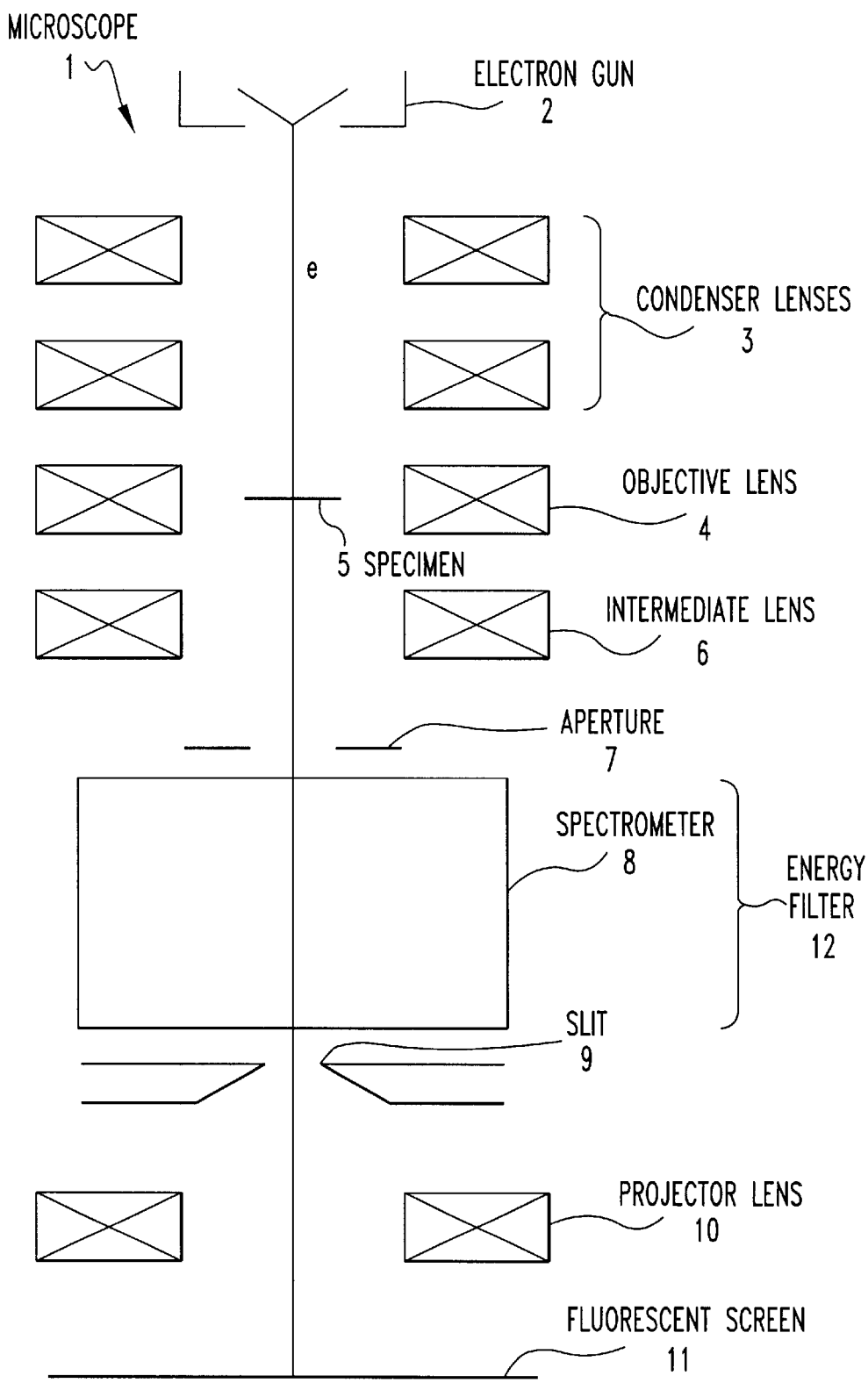
FIG. 6 is a schematic diagram of the prior art electron microscope having electron optics incorporating an energy filter.

In the spectrometer 8 shown in FIG. 4, two discrete electron-deflecting magnet assemblies 13 and 13' are used. As shown in FIG. 5, of the components of the two electron-deflecting magnet assemblies 13 and 13', the polepieces 14 and 14' may be integrally fabricated in the polepiece base 100. Also, the polepieces 15 and 15' may be integrally fabricated in the polepiece base 101. Furthermore, the spacers 36 and 36' may be formed into one larger spacer 36. The spacers 37 and 37' may be formed into one larger spacer 37. The electron passage grooves 40 and 40' may be formed into one larger electron passage groove 40. The electron passage grooves 43 and 43' may be formed into one larger electron passage groove 43. The O-ring grooves 39 and 39' may be formed into one larger O-ring groove 39. The O-ring grooves 42 and 42' may be formed into one larger O-ring groove 42. The O-ring grooves 38 and 38' may be formed into one larger O-ring groove 38. The O-ring grooves 41 and 41' may be formed into one larger O-ring groove 41. In this case, the magnet assemblies may be fabricated without a platen 48 shown in FIG. 5.

Figure 11A:
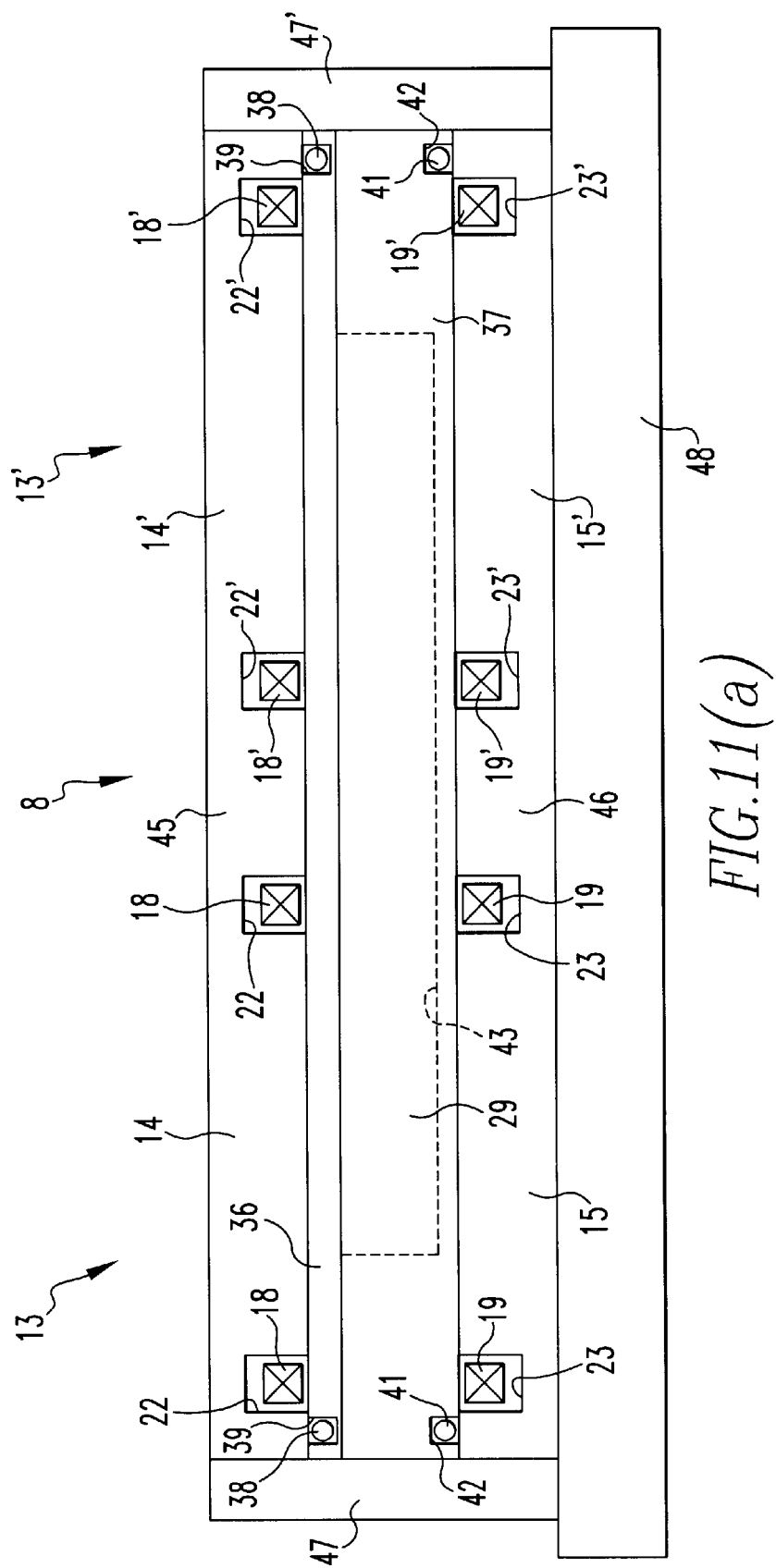
FIG. 11(a) is a view of a modification of the spacer shown in FIG. 5.
Figure 11B:
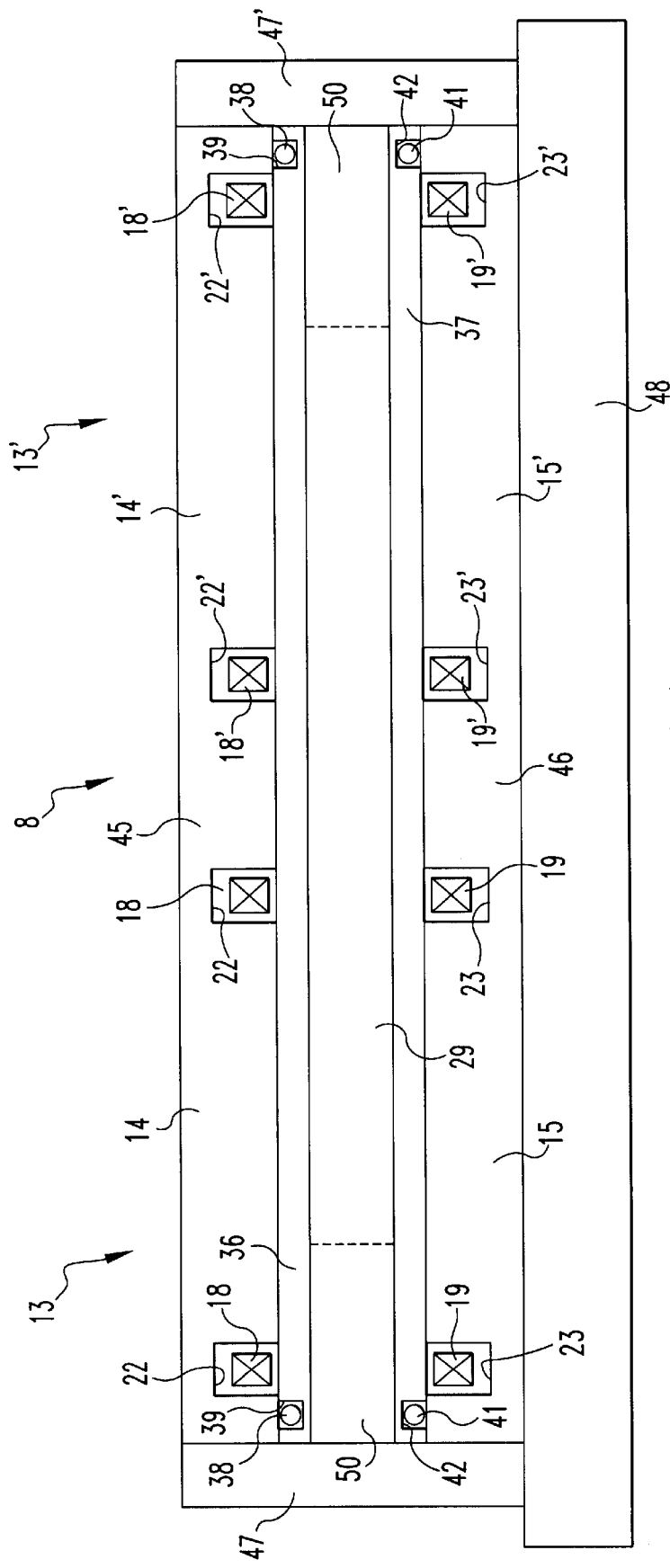
FIG. 11(b) is a view of another modification of the spacer shown in FIG. 5.

As shown in FIG. 11(*a*), the electron passage 29 may have a deeper groove portion 43 whose depth is equal to the sum of the depths of the electron passage grooves 40 and 43 of the structure shown in FIG. 5. The deeper groove portion 43 is formed only in one (e.g., the spacer 37) of the two spacers 36 and 37. In this case, the spacer 36 has no electron passage groove.

As shown in FIG. 11(*b*), the electron passage 29 may be made by inserting third spacers 50 between the spacers 36 and 37 which have no electron passage groove. The thickness of the third spacers 50 is equal to the depth of the deeper groove 43.

As can be understood from the description provided thus far, in the energy filter in accordance with the present invention, sealing members permit coils of magnets to be located outside a vacuum. Therefore, deterioration of the vacuum inside the electron microscope can be prevented. This prevents deterioration of the performance of the microscope.

At least one electron passage groove is formed in one of a pair of spacers, or a third spacer is inserted between a pair of spacers, to form one electron passage. Consequently, this structure is easier to machine and cleanse than the prior art tube.

Furthermore, it is not necessary to set large the distance between a pair of polepieces, since no tube is accommodated in the electron passage. Hence, the magnet assembly can be designed compactly. In addition, a small-sized power supply suffices.

Additionally, shunts for preventing ooze of magnetic fields are coupled to these polepieces at their bulges. Therefore, it is not necessary to take account of the accuracy with which they are assembled. In consequence, the magnet assembly can be assembled with improved efficiency.

Having thus described my invention with the detail and particularity required by the Patent Laws, what is desired protected by Letters Patent is set forth in the following claims.

What is claimed is:

1. An energy filter consisting of at least one magnet assembly and mounted within a vacuum created inside an electron microscope, said energy filter arranged to receive incident electrons including electrons having a given energy, said energy filter acting to pass the electrons having said given energy, said energy filter comprising:

said magnet assembly having a pair of polepiece bases having large planar surfaces;

each of said polepiece bases being provided with a coil groove recessed from said large planar facing surfaces thereof;

portions of said pole piece bases surrounded by the coil grooves in said polepiece bases defining polepieces, respectively, such that each portion defines one polepiece;

coils received in said coil grooves, respectively;

said polepiece bases being so positioned that said polepieces are located opposite to each other;

first and second nonmagnetic spacers each having a large planar surface;

a yoke mounted to side surfaces of said polepiece bases;

sealing grooves formed in said spacers recessed from said large planar surfaces of said spacers, respectively, to hermetically seal said coils in said coil grooves in said polepiece bases;

said first and second spacers being overlapped, abutting upon each other, and inserted between said polepiece bases such that planar surfaces of said spacers abut planar surfaces of said polepieces except at the location of coil and sealing grooves;

at least one electron passage gap formed between said spacers to form an electron passage; and sealing members received in said grooves, respectively, to permit said coils to be located outside said vacuum.

2. The energy filter of claim 1, wherein said polepiece bases have bulges swelling outward from said coil grooves, respectively, and form shunts for preventing spreading of magnetic fields.

3. The energy filter of claim 1 or 2, wherein said at least one magnet assembly is plural in number and fixedly mounted to a platen.

4. The energy filter of claim 1 or 2, wherein said at least one magnet assembly is plural in number;

said plural magnet assemblies have first magnet assemblies;

said first magnet assemblies have a pair of polepiece bases and a pair of spacers;

each of said polepiece bases has plural coil grooves;

sealing grooves are formed in said formed spacers, respectively, such that one sealing groove exists in each one spacer and surrounds all of said plural coil grooves to hermetically seal the plural coils received in the coil grooves, respectively; and sealing members are received in said sealing grooves, respectively, such that one sealing member is in one sealing groove.

* * * * *

UNITED STATES PATENT AND TRADEMARK OFFICE
CERTIFICATE OF CORRECTION

PATENT NO.    : 6,483,110 B1
DATED         : November 19, 2002
INVENTOR(S)   : Toshikatsu Kaneyama It is certified that error appears in the above-identified patent and that said Letters Patent is hereby corrected as shown below:

<u>Column 4,</u>
Line 64, "FIGS. 3(a) and 3(b)" should read -- FIGS. 1(a) and 1(b) --.

Signed and Sealed this

Thirteenth Day of May, 2003

JAMES E. ROGAN
*Director of the United States Patent and Trademark Office*